United States Patent
Kang et al.

(10) Patent No.: US 7,868,344 B2
(45) Date of Patent: Jan. 11, 2011

(54) NITRIDE SEMICONDUCTOR LIGHT EMITTING DEVICE INCLUDING ELECTRODES OF A MULTILAYER STRUCTURE

(75) Inventors: Pil Geun Kang, Suwon (KR); Bong Il Yi, Suwon (KR); Jae Ho Han, Daejeon (KR); Dong Min Jeon, Suwon (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 1122 days.

(21) Appl. No.: 11/517,343

(22) Filed: Sep. 8, 2006

(65) Prior Publication Data
US 2010/0308366 A1    Dec. 9, 2010

(30) Foreign Application Priority Data
Sep. 9, 2005    (KR) ............... 10-2005-0084006

(51) Int. Cl.
*H01L 33/00* (2010.01)
(52) U.S. Cl. ................... 257/99; 257/E33.068
(58) Field of Classification Search ........... 257/98, 257/99, 676, 778, E33.068
See application file for complete search history.

(56) References Cited

U.S. PATENT DOCUMENTS

| 7,193,249 | B2 | 3/2007 | Seong et al. | |
| 2002/0123164 | A1* | 9/2002 | Slater et al. | 438/39 |
| 2003/0015721 | A1* | 1/2003 | Slater et al. | 257/99 |
| 2005/0116620 | A1 | 6/2005 | Kobayashi | |
| 2007/0096126 | A1 | 5/2007 | Kamei | |

FOREIGN PATENT DOCUMENTS

| JP | 6-97498 | 4/1994 |
| JP | 2002-280618 | 9/2002 |
| JP | 2005-045038 | 2/2005 |
| JP | 2005-123631 | 5/2005 |
| JP | 2005-203765 | 7/2005 |
| JP | 2005-223165 | 8/2005 |

OTHER PUBLICATIONS

Japanese Office Action issued in Japanese Patent Application No. 2006-244343, mailed Mar. 2, 2010.
Japanese Office Action, with English translation, issued in Japanese Patent Application No. 2006-244343, mailed Oct. 12, 2010.

* cited by examiner

*Primary Examiner*—Thomas L Dickey
(74) *Attorney, Agent, or Firm*—McDermott Will & Emery LLP

(57) ABSTRACT

A nitride semiconductor LED comprises a substrate; an n-type nitride semiconductor layer formed on the substrate; an active layer formed on a predetermined region of the n-type nitride semiconductor layer; a p-type nitride semiconductor layer formed on the active layer; a p-electrode formed on the p-type nitride semiconductor layer; and an n-electrode formed on the n-type nitride semiconductor layer in which the active layer is not formed. The p-electrode and n-electrode are formed to have such a multilayer structure that an ohmic contact layer, a compound layer containing aluminum or silver, and a degradation preventing layer are sequentially laminated.

10 Claims, 3 Drawing Sheets

[FIG. 1] PRIOR ART
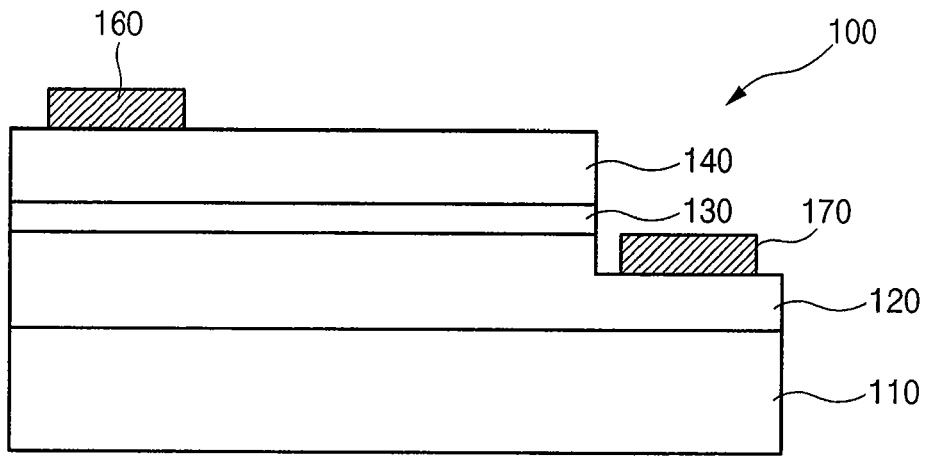
[FIG. 2] PRIOR ART
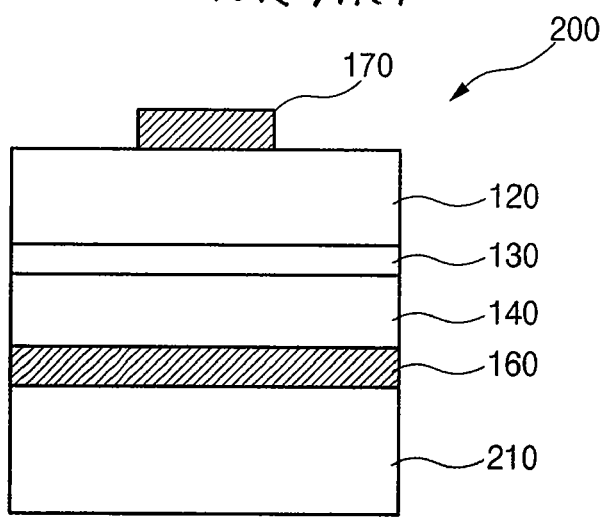
[FIG. 3]
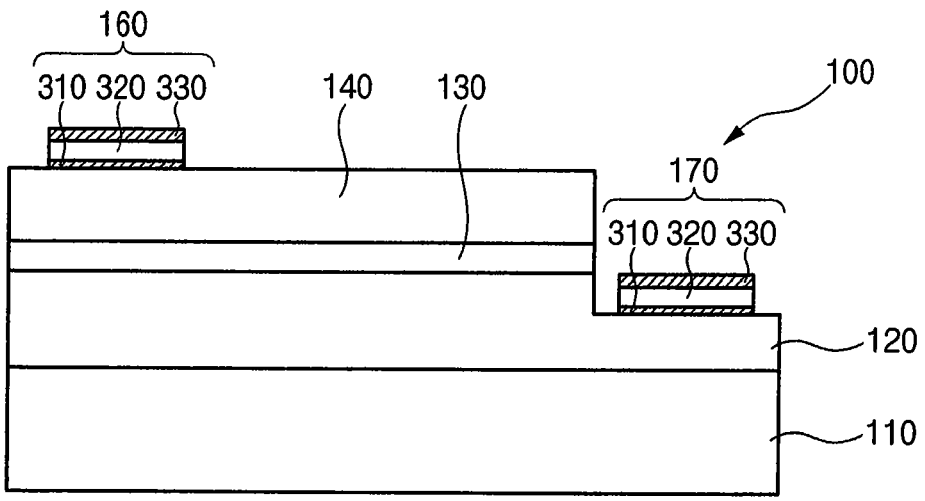

[FIG. 4A]
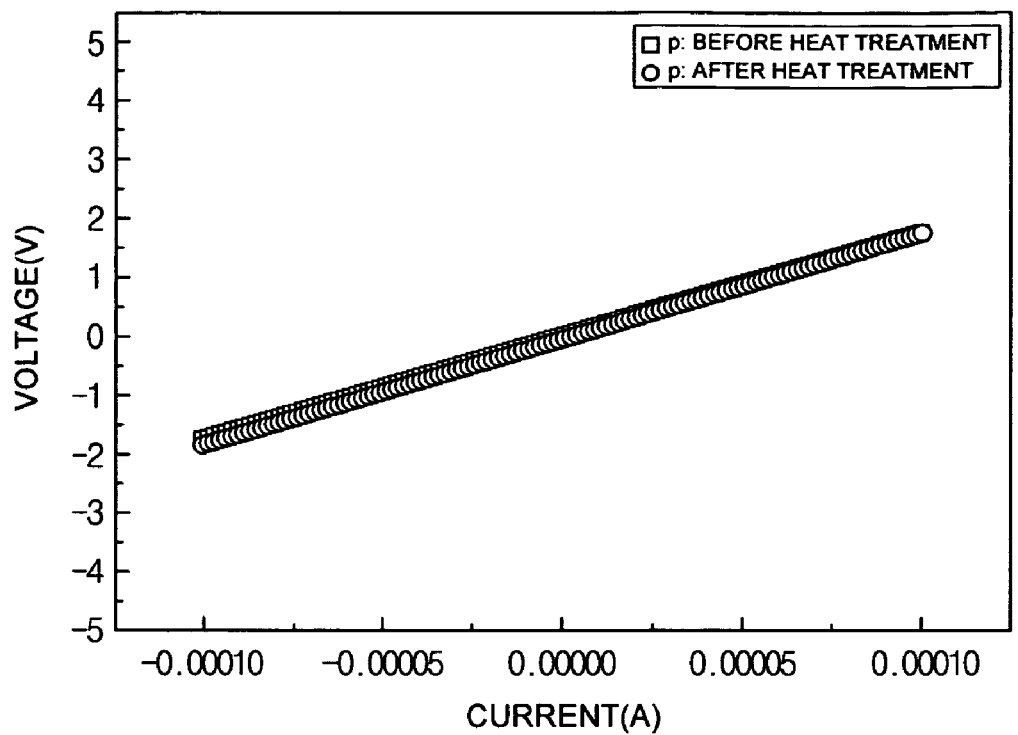
[FIG. 4B]
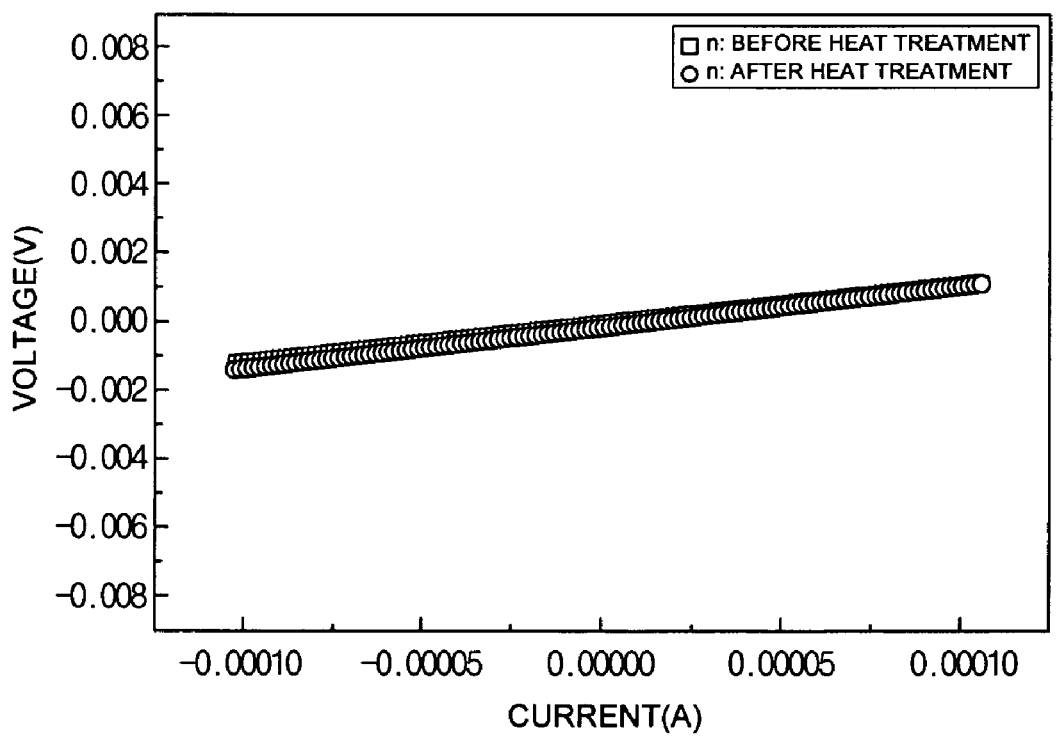

[FIG. 5]
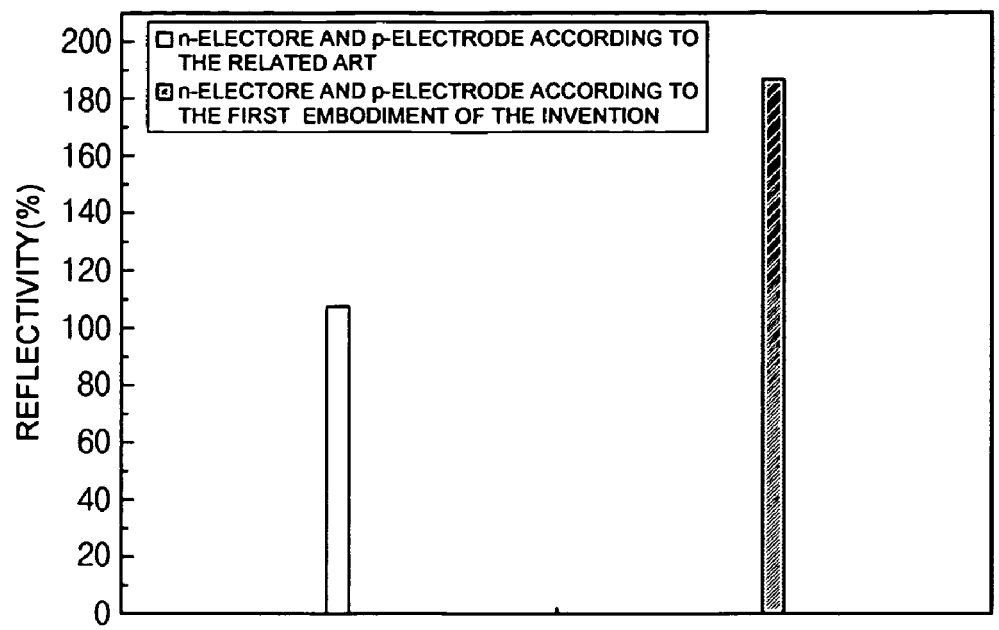
[FIG. 6]
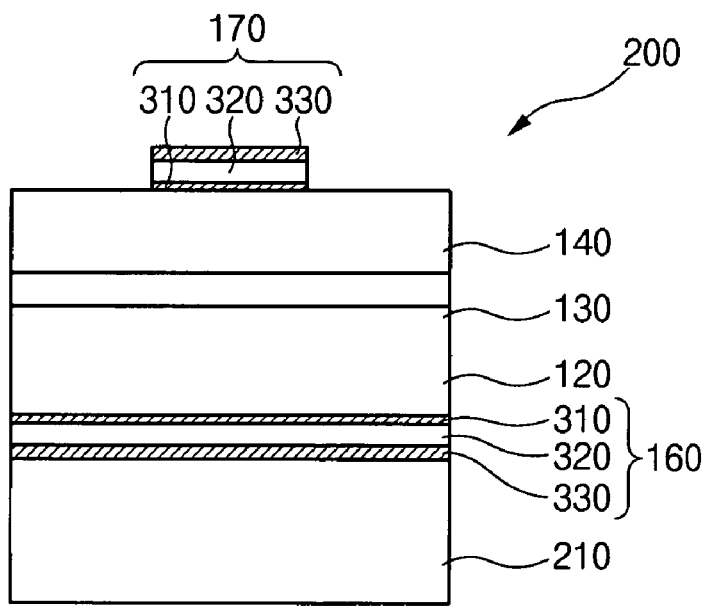

NITRIDE SEMICONDUCTOR LIGHT EMITTING DEVICE INCLUDING ELECTRODES OF A MULTILAYER STRUCTURE

CROSS-REFERENCE TO RELATED APPLICATIONS

The application claims the benefit of Korea Patent Application No. 2005-84006 filed with the Korea Intellectual Property Office on Sep. 9, 2005, the disclosure of which is incorporated herein by reference.

BACKGROUND OF THE INVENTION

1. Field of the Invention

The present invention relates to a nitride semiconductor light emitting diode (LED) which maintains low ohmic contact resistance, thereby enhancing the light extraction efficiency.

2. Description of the Related Art

In general, a nitride semiconductor is such a material that has a relatively high energy band gap (in the case of GaN semiconductor, about 3.4 eV), and is positively adopted in an optical device for generating green or blue short-wavelength light. As such a nitride semiconductor, a material having a composition of $Al_xIn_yGa_{1-x-y}N$ (herein, $0 \leq x \leq 1$, $0 \leq y \leq 1$, and $0 \leq x+y \leq 1$) is widely used.

However, since such a nitride semiconductor has a relatively large energy band-gap, it is difficult to form the ohmic contact with an electrode. Particularly, since a p-type and n-type nitride semiconductor layers have a larger energy band-gap, the contact resistance on the contact portion with p-type and n-type electrodes increases. Such an increase causes an operational voltage of the device to increase, thereby increasing the heating value. Further, the p-type and n-type electrodes of a conventional nitride semiconductor LED are formed of Cr/Au with low reflectivity. Therefore, light emitted from an active layer is not totally reflected, but is partially absorbed, thereby reducing the light extraction efficiency.

Such a nitride semiconductor LED is divided into a lateral LED and a vertical LED.

Now, the conventional nitride semiconductor LED will be described in detail with reference to drawings.

First, a lateral nitride semiconductor LED of the conventional nitride semiconductor LED will be described with reference to FIG. 1.

FIG. 1 is a sectional view illustrating the structure of the conventional lateral nitride semiconductor LED.

As shown in FIG. 1, the conventional vertical nitride semiconductor LED 100 includes a sapphire substrate 110, a GaN buffer layer (not shown), an n-type nitride semiconductor layer 120, an active layer 130, and a p-type nitride semiconductor layer 140, which are sequentially grown. Portions of the p-type nitride semiconductor layer 140 and the GaN/InGaN active layer 130 are removed by mesa-etching, so that a portion of the upper surface of the n-type nitride semiconductor layer 120 is exposed.

On the exposed n-type nitride semiconductor layer 120, a negative electrode (n-electrode) 170 is formed of Cr/Au. On the p-type nitride semiconductor layer 140, a positive electrode (p-electrode) 160 is formed of Cr/Au.

The n-type nitride semiconductor layer 120 and the p-type nitride semiconductor layer 140 have a large energy band-gap. Therefore, if the n-type nitride semiconductor layer 120 and the p-type nitride semiconductor layer 140 respectively come in contact with the n-electrode 170 and the p-electrode 160, the contact resistance increases. Such an increase causes an operational voltage of the device to increase, thereby increasing the heating value.

The p-electrode 160 and the n-electrode 170 are formed of the same material, such as Cr/Au, and simultaneously come in ohmic contact with the p-type and n-type nitride semiconductor layers 140 and 120, thereby simplifying the process. However, the p-electrode and n-electrode absorbs some light emitted from the active layer, thereby reducing the entire luminous efficiency of the device. That is, since the p-electrode and n-electrode formed of Cr/Au have low reflectivity, light directed to the p-electrode and n-electrode among light emitted from the active layer is absorbed. Therefore, the light extraction efficiency decreases, thereby reducing the brightness of the device.

Referring to FIG. 2, the conventional vertical nitride semiconductor LED will be described.

FIG. 2 is a sectional view illustrating the structure of the conventional vertical nitride semiconductor LED.

As shown in FIG. 2, the conventional vertical nitride semiconductor LED 200 includes an n-electrode 170, an n-type nitride semiconductor layer 120, an active layer 130, a p-type nitride semiconductor layer 140, a p-electrode 160, and a support layer 210, which are sequentially formed.

In the vertical nitride semiconductor LED, however, the n-type nitride semiconductor layer 120 and the p-type nitride semiconductor layer 140 have a large energy band-gap. Therefore, when the n-type nitride semiconductor layer 120 and the p-type nitride semiconductor layer 140 respectively come in contact with the n-electrode 170 and the p-electrode 160, the contact resistance increases. Such an increase causes an operational voltage of the device to increase, thereby increasing the heating value.

Further, since the p-electrode 160 and the n-electrode 170 are formed of Cr/Au, some light emitted from the active is absorbed, thereby reducing the entire luminous efficiency of the device.

SUMMARY OF THE INVENTION

An advantage of the present invention is that it provides a nitride semiconductor LED in which an n-electrode and p-electrode, having low ohmic contact resistance and having a multilayer structure formed of a material with excellent reflectivity and heat resistance, respectively are provided on n-type and p-type nitride semiconductor layers. Therefore, the heating value of the device can be reduced to improve reliability. Further, some light emitted from an active layer can be prevented from being absorbed into the n-electrode and p-electrode, thereby enhancing the light extraction efficiency.

Additional aspects and advantages of the present general inventive concept will be set forth in part in the description which follows and, in part, will be obvious from the description, or may be learned by practice of the general inventive concept.

According to an aspect of the invention, a nitride semiconductor LED comprises a substrate; an n-type nitride semiconductor layer formed on the substrate; an active layer formed on a predetermined region of the n-type nitride semiconductor layer; a p-type nitride semiconductor layer formed on the active layer; a p-electrode formed on the p-type nitride semiconductor layer; and an n-electrode formed on the n-type nitride semiconductor layer in which the active layer is not formed. The p-electrode and n-electrode are formed to have such a multilayer structure that an ohmic contact layer, a compound layer containing aluminum or silver, and a degradation preventing layer are sequentially laminated.

According to another aspect of the invention, the nitride semiconductor LED further comprises a current spreading layer formed at the interface between the p-type nitride semiconductor layer and the p-electrode.

According to a further aspect of the invention, a nitride semiconductor LED comprises an n-electrode; an n-type nitride semiconductor layer formed under the n-electrode; an active layer formed under the n-type nitride semiconductor layer; a p-type nitride semiconductor layer formed under the active layer; a p-electrode formed under the p-type nitride semiconductor layer; and a support layer formed under the p-electrode. The p-electrode and n-electrode are formed to have such a multilayer structure that an ohmic contact layer, a compound layer containing aluminum or silver, and a degradation preventing layer are sequentially laminated from the surface of the adjacent nitride semiconductor layer.

According to a still further aspect of the invention, the ohmic contact layer is formed of Cr or a compound layer containing Cr. The ohmic contact layer improve ohmic contact resistance of the n-type and p-type nitride semiconductor layers having a relatively large energy band gap and to enhance an adhesive force between the n-type and p-type nitride semiconductor layers and the compound layer containing aluminum or silver.

The ohmic contact layer should have a thickness of less than 200 Å in order to secure high reflectivity of the p-electrode and n-electrode and should have a thickness of more than 1 Å in order to enhance the ohmic contact resistance and adhesive force. Preferably, the ohmic contact layer has a thickness of 1 Å to 200 Å.

According to a still further aspect of the invention, one or more metallic additives, selected from the group consisting of Cu, Si, W, Mo, Co, and Ni, are added into the compound layer containing aluminum or silver. This makes it possible to prevent aluminum or silver, composing the p-electrode and n-electrode, from being degraded by hill-rock or the like occurring during a heating process. Therefore, low ohmic contact resistance and high reflectivity of aluminum or silver are maintained as they are. Further, the compound layer containing aluminum or silver has a thickness of 500 Å to 20,000 Å.

According to a still further aspect of the invention, the degradation preventing layer is formed of one or more metals selected from the group consisting of Ti, Ni, Mo, Pt, Pd, Rh, and Ru. Therefore, the degradation preventing layer can prevent the compound layer from being degraded by heat. Preferably, the degradation preventing layer has a thickness of 50 Å to 10,000 Å.

According to a still further aspect of the invention, the p-electrode and n-electrode are formed by further including an oxidation preventing layer formed on the degradation preventing layer, and the oxidation preventing layer is formed of a combination of elements, which are selected from the group consisting of Ti, Ni, Mo, Pt, Pd, Rh, and Ru and are not used in the degradation preventing layer, or a compound containing the elements. The oxidation preventing layer can prevent the degradation preventing layer from being oxidized due to exposure to the air.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a sectional view illustrating the structure of a conventional vertical nitride semiconductor LED;

FIG. 2 is a sectional view illustrating the structure of the conventional vertical nitride semiconductor LED;

FIG. 3 is a sectional view illustrating the structure of a nitride semiconductor LED according to a first embodiment of the present invention;

FIGS. 4A and 4B are graphs showing ohmic contact (I-V curve) of p-electrode and n-electrode of the nitride semiconductor LED shown in FIG. 3;

FIG. 5 is a diagram comparatively showing the reflectivity of the nitride semiconductor LEDs shown in FIGS. 1 and 3; and FIG. 6 is a sectional view illustrating the structure of a nitride semiconductor LED according to a second embodiment of the invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Hereinafter, preferred embodiments of the present invention will be described in detail with reference to the accompanying drawings.

First Embodiment

First, a nitride semiconductor LED according to a first embodiment of the invention will be described in detail with reference to FIG. 3. FIG. 3 is a sectional view illustrating the structure of the nitride semiconductor LED according to the first embodiment of the invention.

As shown in FIG. 3, a buffer layer (not shown), an n-type nitride semiconductor layer 120, an active layer 130, and a p-type nitride semiconductor layer 140 are sequentially formed on a substrate 110.

Preferably, the substrate 110 is formed of a transparent material including sapphire. Except for sapphire, the substrate 110 may be formed of zinc oxide (ZnO), gallium nitride (GaN), silicon carbide (SiC), or aluminum nitride (AlN).

The buffer layer (not shown) is formed of GaN and may be omitted.

The n-type or p-type nitride semiconductor layer 120 or 140 is formed of a GaN layer or GaN/AlGaN layer doped with conductive impurities, and the active layer 130 is formed to have a multi-quantum well structure formed of an InGaN/GaN layer.

The active layer 130 may be formed of a quantum well layer or double-hetero structure. Further, whether a diode is a green LED or blue LED is determined by an amount of indium (In) composing the active layer 130. More specifically, in an LED emitting blue light, a proportion of indium is 22%. In an LED emitting green light, a proportion of indium is 40%. That is, an amount of indium used for forming the active layer 130 changes in accordance with a required blue or green wavelength.

Portions of the active layer 130 and the p-type nitride semiconductor layer 140 are removed by mesa-etching such that a groove is formed so as to expose the n-type nitride semiconductor layer 120.

On the p-type nitride semiconductor layer 140, a current spreading layer (not shown) is formed. The current spreading layer may be omitted when current spreading is excellent or in accordance with a process or device characteristic.

On the exposed n-type nitride semiconductor layer 120 and the p-type nitride semiconductor layer 140, an n-electrode 170 and a p-electrode 160 are respectively formed. The n-electrode 170 and the p-electrode 160 serve as a reflective layer and an electrode. Since the n-electrode 170 and the p-electrode 160 are formed of the same material on the same layer, the n-type nitride semiconductor layer 120 and the p-type nitride semiconductor layer 140 simultaneously comes in ohmic contact. Therefore, it is possible to simplify a process of forming the n-electrode 170 and the p-electrode 160.

Hereinafter, the p-electrode 160 and the n-electrode 170 serving as a reflective layer and an electrode will be described in detail.

The p-electrode 160 and the n-electrode 170 according to the first embodiment of the invention have such a multilayer structure that an ohmic contact layer 310, a compound layer 320, and a degradation preventing layer 330 are sequentially laminated on the p-type or n-type nitride semiconductor layer 120 or 140, the compound layer 320 containing aluminum (Al) or silver (Ag).

Preferably, the ohmic contact layer 310 is formed of Cr or a compound layer containing Cr. The ohmic contact layer 310 serves to improve ohmic contact resistance of the n-type and p-type nitride semiconductor layers 120 and 140 having a relatively large energy band gap and to enhance an adhesive force between the n-type and p-type nitride semiconductor layers 120 and 140 and the compound layer 320 containing aluminum or silver. The ohmic contact layer 310 has a thickness of more than 1 Å in order to enhance the ohmic contact resistance and adhesive force. When the ohmic contact layer 310 has a thickness of more than 200 Å, the reflectivity of the n-electrode 170 and the p-electrode 160 is reduced. Therefore, the ohmic contact layer 310 preferably has a thickness of 1 Å to 200 Å. In this embodiment, the ohmic contact layer 310 has a thickness of 2 Å to 50 Å.

As for the compound layer 320 containing aluminum (Al) or silver (Ag), a layer is preferably used, into which one or more heat-resisting metallic additives selected from a group consisting of Cu, Si, W, Mo, Co, and Ni are added. Such a structure prevents aluminum or silver, composing the compound layer 320, from being degraded by a heating process.

That is, aluminum (Al) or silver (Ag) composing the compound layer 320 is easily degraded by hill-rock or the like occurring during a heating process. If such degradation occurs, aluminum or silver cannot maintain its characteristics such as low ohmic contact resistance or high reflectivity. In this embodiment, however, heat-resisting metallic additives are added to the compound layer 320 containing aluminum or silver, thereby preventing the degradation caused by a heating process. Therefore, aluminum or silver can maintain its characteristics such as low ohmic contact resistance or high reflectivity. At this time, if the thickness of the compound layer 320 is less than 500 Å, the compound layer 320 containing aluminum or silver cannot have a reflecting function. If the thickness of the compound layer 320 is more than 20,000 Å, stress is generated due to the thickness, thereby weakening the contact property. Therefore, the compound layer 320 preferably has a thickness of 500 Å to 20,000 Å.

The degradation preventing layer 330 serves to prevent the compound layer 320 from being degraded and is preferably formed of one or more heat-resisting metals selected from the group consisting of Ti, Ni, Mo, Pt, Pd, Rh, and Ru. If the thickness of the degradation preventing layer 330 is less than 50 Å, the degradation preventing layer 330 cannot play a roll of preventing the degradation. If the thickness of the degradation preventing layer 330 is more than 10,000 Å, stress is generated due to the thickness, thereby weakening the contact property. Preferably, the degradation preventing layer 330 has a thickness of 50 Å to 10,000 Å.

FIGS. 4A and 4B are graphs showing ohmic-contact (I-V curve) of the p-electrode and the n-electrode of the nitride semiconductor LED shown in FIG. 3. FIG. 5 is a diagram comparatively showing the reflectivity of the nitride semiconductor LEDs shown in FIGS. 1 and 3.

Referring to FIGS. 4A and 4B, it can be found that the p-electrode 160 and the n-electrode 170 maintain low ohmic contact resistance even though the heat treatment is applied. The p-electrode 160 and the n-electrode 170 have such a multilayer structure that the ohmic contact layer 310, the compound layer 320 containing aluminum or silver, and the degradation preventing layer 330 are sequentially laminated.

Referring to FIG. 5, the reflectivity of the p-electrode 170 and the n-electrode 160 with respect to silicon (Si) is 190% in this embodiment. On the contrary, the reflectivity of the n-electrode and p-electrode with respect to silicon (Si) is 104% in the related art, the n-electrode and p-electrode being formed of Cr/Au. That is, the reflectivity of the n-electrode and p-electrode according to the first embodiment of the invention increases as much as 86%, compared with that of the n-electrode and p-electrode according to the related art. Therefore, light directed to the n-electrode among light emitted from the active layer is reflected so as to be discharged into the light-emitting surface, thereby improving the light extraction efficiency of the LED.

Meanwhile, the n-electrode 170 and the p-electrode 160 may be formed to have a quadruple layer structure. In the quadruple layer structure, an oxidation preventing layer (not shown) is further formed on the triple layer structure in which the ohmic contact layer 310, the compound layer 320 containing aluminum or silver, and the degradation preventing layer 330 are sequentially laminated. In other words, the ohmic contact layer 310, the compound layer 320 containing aluminum or silver, the degradation preventing layer 330, and the oxidation preventing layer are sequentially laminated.

As described above, when the oxidation preventing layer is positioned on the degradation preventing layer 330, the oxidation preventing layer can prevent the degradation preventing layer 330 from being oxidized due to exposure to the air.

Preferably, the oxidation preventing layer is formed of a combination of elements, which are selected from the group consisting of Ti, Ni, Mo, Pt, Pd, Rh, and Ru and are not used in the degradation preventing layer, or a compound containing them. Further, if the thickness of the oxidation preventing layer is less than 50 Å, the oxidation preventing layer cannot play a roll of preventing oxidation. If the thickness of the oxidation preventing layer is more than 10,000 Å, stress is generated due to the thickness, thereby weakening the contact property of the oxidation preventing layer 230. Therefore, the oxidation preventing layer preferably has a thickness of 50 Å to 20,000 Å.

Second Embodiment

Referring to FIG. 6, a second embodiment of the invention will be described. The descriptions of the same parts as the first embodiment of the present invention will be omitted for conciseness.

FIG. 6 is a sectional view illustrating the structure of a nitride semiconductor LED according to the second embodiment of the invention.

The nitride semiconductor LED 200 according to the second embodiment has almost the same construction as the nitride semiconductor LED according to the first embodiment. As shown in FIG. 6, however, the n-electrode 170 is formed on the rear surface of the n-type nitride semiconductor layer 120 on which the active layer 130 is formed, compared with the first embodiment in which the n-electrode 170 having a multilayer structure is formed on the n-type nitride semiconductor layer 120 exposed by removing portions of the active layer 130 and the p-type nitride semiconductor layer 140. Further, a support layer 210 is bonded to the rear surface of the p-electrode 160 by a conductive bonding layer (not shown). The support layer 210 serves as a final layer supporting the LED and an electrode and is composed of a silicon (Si) substrate, a GaAs substrate, a Ge substrate, or a metallic layer. The metallic layer may be formed by electroplating, non-electroplating, thermal evaporation, e-beam evaporation, sputtering, CVD or the like.

That is, the first embodiment exemplifies a lateral light emitting diode, and the second embodiment exemplifies a vertical light emitting diode. The second embodiment has the same operation and effect as the first embodiment.

As described above, the n-electrode and the p-electrode, which have low ohmic contact resistance and high reflectivity and are formed of a multilayer structure with excellent heat resistance, respectively are provided on the n-type and p-type nitride semiconductor layers. Such a structure can reduce the heating value of the device so as to improve the reliability. Further, some light generated from the active layer is prevented from being absorbed into the n-electrode and p-electrode, which makes it possible to enhance the light extraction efficiency.

In the present invention, it is possible to improve the brightness, characteristic, and reliability of the nitride semiconductor LED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A nitride semiconductor LED comprising:
   a substrate;
   an n-type nitride semiconductor layer formed on the substrate;
   an active layer formed on a predetermined region of the n-type nitride semiconductor layer;
   a p-type nitride semiconductor layer formed on the active layer;
   a p-electrode formed on the p-type nitride semiconductor layer; and
   an n-electrode formed on the n-type nitride semiconductor layer in which the active layer is not formed,
   wherein the p-electrode and n-electrode are formed to have such a multilayer structure that an ohmic contact layer, a compound layer containing aluminum or silver, and a degradation preventing layer are sequentially laminated, and
   the ohmic contact layer is formed of Cr or a compound layer containing Cr.

2. The nitride semiconductor LED according to claim 1 further comprising a current spreading layer formed at the interface between the p-type nitride semiconductor layer and the p-electrode.

3. The nitride semiconductor LED according to claim 1, wherein the ohmic contact layer has a thickness of 1 Å to 200 Å.

4. The nitride semiconductor LED according to claim 1, wherein the degradation preventing layer is formed of two or more metals selected from the group consisting of Mo, Pt, Pd, Rh, and Ru.

5. The nitride semiconductor LED according to claim 4, wherein the degradation preventing layer has a thickness of 50 Å to 10,000 Å.

6. A nitride semiconductor LED comprising:
   an n-electrode;
   an n-type nitride semiconductor layer formed under the n-electrode;
   an active layer formed under the n-type nitride semiconductor layer;
   a p-type nitride semiconductor layer formed under the active layer;
   a p-electrode formed under the p-type nitride semiconductor layer; and
   a support layer formed under the p-electrode,
   wherein the p-electrode and n-electrode are formed to have such a multilayer structure that an ohmic contact layer, a compound layer containing aluminum or silver, and a degradation preventing layer are sequentially laminated from the surface of the adjacent nitride semiconductor layer, and
   the ohmic contact layer is formed of Cr or a compound layer containing Cr.

7. A nitride semiconductor LED comprising:
   a substrate;
   an n-type nitride semiconductor layer formed on the substrate;
   an active layer formed on a predetermined region of the n-type nitride semiconductor layer;
   a p-type nitride semiconductor layer formed on the active layer;
   a p-electrode formed on the p-type nitride semiconductor layer; and
   an n-electrode formed on the n-type nitride semiconductor layer in which the active layer is not formed,
   wherein the p-electrode and n-electrode are formed to have such a multilayer structure that an ohmic contact layer, a compound layer containing aluminum or silver, and a degradation preventing layer are sequentially laminated, and
   one or more metallic additives, selected from the group consisting of Cu, Si, W, Mo, Co, and Ni, are added into the compound layer containing aluminum or silver.

8. The nitride semiconductor LED according to claim 7, wherein the compound layer containing aluminum or silver has a thickness of 500 Å to 20,000 Å.

9. A nitride semiconductor LED comprising:
   a substrate;
   an n-type nitride semiconductor layer formed on the substrate;

an active layer formed on a predetermined region of the n-type nitride semiconductor layer;

a p-type nitride semiconductor layer formed on the active layer;

a p-electrode formed on the p-type nitride semiconductor layer; and an n-electrode formed on the n-type nitride semiconductor layer in which the active layer is not formed, wherein the p-electrode and n-electrode are formed to have such a multilayer structure that an ohmic contact layer, a compound layer containing aluminum or silver, and a degradation preventing layer are sequentially laminated, the p-electrode and n-electrode are formed by further including an oxidation preventing layer formed on the degradation preventing layer, and the oxidation preventing layer is formed of a combination of elements, which are selected from the group consisting of Ti, Ni, Mo, Pt, Pd, Rh, and Ru and are not used in the degradation preventing layer, or a compound containing the elements.

10. The nitride semiconductor LED according to claim 9, wherein the degradation preventing layer has a thickness of 50 Å to 10,000 Å.

* * * * *